United States Patent
Zhu

(10) Patent No.: US 10,380,407 B2
(45) Date of Patent: Aug. 13, 2019

(54) FINGERPRINT IDENTIFICATION APPARATUS AND METHOD FOR MANUFACTURING THE SAME

(71) Applicant: SHENZHEN GOODIX TECHNOLOGY CO., LTD., Shenzhen, Guangdong (CN)

(72) Inventor: Jianyu Zhu, Guangdong (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 69 days.

(21) Appl. No.: 15/697,832

(22) Filed: Sep. 7, 2017

(65) Prior Publication Data

US 2018/0204042 A1 Jul. 19, 2018

Related U.S. Application Data

(63) Continuation of application No. PCT/CN2017/071653, filed on Jan. 19, 2017.

(51) Int. Cl.
  *G06K 9/20* (2006.01)
  *G06K 9/00* (2006.01)
  *H05K 1/03* (2006.01)
  *H04M 1/02* (2006.01)

(52) U.S. Cl.
  CPC ....... *G06K 9/00087* (2013.01); *G06K 9/0002* (2013.01); *G06K 9/00053* (2013.01);
  (Continued)

(58) Field of Classification Search
  CPC .................................... G06K 9/00006–9/0012
  See application file for complete search history.

(56) References Cited

U.S. PATENT DOCUMENTS

2014/0118832 A1 5/2014 Gil et al.
2015/0124179 A1 5/2015 Ko et al.
(Continued)

FOREIGN PATENT DOCUMENTS

CN 102416738 A 4/2012
CN 204613972 U 9/2015
(Continued)

OTHER PUBLICATIONS

English machine translation of CN106022261A, Qin et al., dated May 19, 2016, pp. 1-5. (Year: 2016).*

(Continued)

*Primary Examiner* — Brian Werner
(74) *Attorney, Agent, or Firm* — Heslin Rothenberg Farley & Mesiti P.C.

(57) ABSTRACT

The present disclosure relates to the technical filed of fingerprint identification, and in particular, relates to a fingerprint identification apparatus and a method for manufacturing the same. The fingerprint identification apparatus includes: a circuit board, a fingerprint sensor, an appearance effect layer, and a covering layer; wherein the fingerprint sensor is arranged on the circuit board, the covering layer is coated over the fingerprint sensor, the appearance effect layer is arranged between the fingerprint sensor and the covering layer, and the appearance effect layer comprises a texture layer and a color layer. In the fingerprint identification apparatus and the method for manufacturing a fingerprint identification apparatus according to the above embodiments of the present disclosure, a texture layer is coated over on the fingerprint sensor or under the cover, and an appearance effect layer is formed by the texture layer and the color layer.

9 Claims, 6 Drawing Sheets

(52) U.S. Cl.
CPC ......... *H04M 1/026* (2013.01); *H04M 1/0283* (2013.01); *H05K 1/0393* (2013.01); *G06K 9/00006* (2013.01)

(56) References Cited

U.S. PATENT DOCUMENTS

| | | | |
|---|---|---|---|
| 2015/0187707 A1* | 7/2015 | Lee | H01L 23/562 324/663 |
| 2017/0004342 A1 | 1/2017 | Rommel | |
| 2018/0129851 A1* | 5/2018 | Hsu | H01L 21/00 |

FOREIGN PATENT DOCUMENTS

| | | |
|---|---|---|
| CN | 106022261 A | 10/2016 |
| CN | 205827389 U | 12/2016 |
| KR | 20150020024 A | 2/2015 |
| KR | 20150051490 A | 5/2015 |
| KR | 20160110092 A | 9/2016 |

OTHER PUBLICATIONS

State Intellectual Property Office of the P.R. China (ISR/CN), "International Search Report for PCT/CN2017/071653", China, dated Jul. 27, 2017.
Extended search report issued for corresponding European application No. 17758790.4 dated Mar. 27, 2018.
Communication pursuant to Article 94(3) EPC issued by the European Patent Office for European Application No. 17758790.4 dated Jan. 16, 2019.

\* cited by examiner

FINGERPRINT IDENTIFICATION APPARATUS AND METHOD FOR MANUFACTURING THE SAME

CROSS-REFERENCE TO RELATED APPLICATIONS

The present application is a continuation of international application No. PCT/CN2017/071653, filed on Jan. 19, 2017, which is incorporated herein by reference in its entirety.

TECHNICAL FIELD

The present disclosure relates to the technical filed of fingerprint identification, and in particular, relates to a fingerprint identification apparatus and a method for manufacturing the same.

BACKGROUND

With the development of technologies, the fingerprint identification technology has become a standard configuration of most smart phones, and the appearance effects of fingerprint identification modules and the manufacturing processes thereof are becoming more and more diversified. At present, most of the smart phones in the market are equipped with a fingerprint identification module which achieves the appearance effects including high-gloss (matte) black, white, golden or the like single color effects, and thus texture pattern appearance effects may not be achieved.

SUMMARY

Embodiments of the present disclosure provide a fingerprint identification apparatus and a method for manufacturing the same, in order to solve the technical problem that in the prior art the fingerprint identification module has a appearance effect lacking diversity and a texture pattern appearance effect may not be achieved.

In order to solve the above problem, embodiments of the present disclosure employ the following technical solution:

A fingerprint identification apparatus is provided, including: a circuit board, a fingerprint sensor, an appearance effect layer, and a covering layer; wherein the fingerprint sensor is arranged on the circuit board, the covering layer is coated over the fingerprint sensor, the appearance effect layer is arranged between the fingerprint sensor and the covering layer, and the appearance effect layer includes a texture layer and a color layer.

In the technical solution employed by embodiments of the present disclosure, the covering layer includes a surface hardening layer or a cover.

In the technical solution employed by embodiments of the present disclosure, when the covering layer is a surface hardening layer, the appearance effect layer is prepared by: preparing a texture abrasive tool for making a texture pattern, coating a transparent colloid on the fingerprint sensor, and pressing the prepared texture abrasive tool onto the transparent colloid, such that a texture layer with valleys and ridges is formed on an upper surface of the fingerprint sensor; and preparing a color layer on the texture layer, and forming the appearance effect layer using the texture layer and the color layer.

In the technical solution employed by embodiments of the present disclosure, when the covering layer is a cover, the appearance effect layer is prepared by: preparing a texture abrasive tool for making a texture pattern, coating a transparent colloid on a lower surface of the cover, and pressing the prepared texture abrasive tool onto the transparent colloid, such that a texture layer with valleys and ridges is formed on the lower surface of the cover; and preparing a color layer under the texture layer, and forming the appearance effect layer using the texture layer and the color layer.

In the technical solution employed by embodiments of the present disclosure, when the covering layer is a cover, the fingerprint identification apparatus further includes an adhesive member, wherein the cover is adhered to an upper part of the fingerprint sensor via the adhesive member.

In the technical solution employed by embodiments of the present disclosure, the appearance effect layer has a thickness of several microns to several tens of microns.

In the technical solution employed by embodiments of the present disclosure, the texture layer is a transparent colloid, the transparent colloid including an ultraviolet curable adhesive or a thermally curable adhesive.

In the technical solution employed by embodiments of the present disclosure, the color layer is prepared by means of a non-conductive vacuum metallization, spraying or screen-printing process, and the color layer includes at least one layer.

In the technical solution employed by embodiments of the present disclosure, the circuit board is a flexible circuit board.

In the technical solution employed by embodiments of the present disclosure, the surface hardening layer is a transparent hardened protection layer prepared by means of spraying using a transparent paint or ink.

In the technical solution employed by embodiments of the present disclosure, a substrate of the cover is glass, sapphire, zirconia ceramic or an organic thin film.

In the technical solution employed by embodiments of the present disclosure, the adhesive member is an epoxy, silica gel, or acrylic system adhesive or adhesive thin film.

In the technical solution employed by embodiments of the present disclosure, the adhesive member has a thickness of between 1 and 20 microns.

Embodiments of the present disclosure provide another technical solution: a method for manufacturing a fingerprint identification apparatus. The method includes:

step a: mounting a fingerprint sensor on a circuit board; and step b: arranging an appearance effect layer over a fingerprint sensor, and coating the covering layer over the fingerprint sensor, wherein the appearance effect layer includes a texture layer and a color layer;

In the technical solution employed by embodiments of the present disclosure, in step b, the covering layer includes a surface hardening layer or a cover.

In the technical solution employed by embodiments of the present disclosure, when the covering layer is a surface hardening layer, in step b, the appearance effect layer is prepared by: preparing a texture abrasive tool for making a texture pattern, coating a transparent colloid on the fingerprint sensor, and pressing the prepared texture abrasive tool onto the transparent colloid, such that a texture layer with valleys and ridges is formed on an upper surface of the fingerprint sensor; and preparing a color layer under the texture layer, and forming the appearance effect layer using the texture layer and the color layer.

In the technical solution employed by embodiments of the present disclosure, when the covering layer is a cover, the appearance effect layer is prepared by: preparing a texture abrasive tool for making a texture pattern, coating a transparent colloid on a lower surface of the cover, and pressing the prepared texture abrasive tool onto the transparent colloid, such that a texture layer with valleys and ridges is formed on the lower surface of the cover; and preparing a color layer under the texture layer, and forming the appearance effect layer using the texture layer and the color layer.

In the technical solution employed by embodiments of the present disclosure, when the covering layer is a cover, in step b, the coating the covering layer over the fingerprint sensor includes: adhering the cover to an upper part of the fingerprint sensor using an adhesive member.

In the technical solution employed by embodiments of the present disclosure, the appearance effect layer has a thickness of several microns to several tens of microns.

In the technical solution employed by embodiments of the present disclosure, the transparent colloid includes an ultraviolet curable adhesive or a thermally curable adhesive.

In the technical solution employed by embodiments of the present disclosure, in step b, the color layer is prepared by means of a non-conductive vacuum metallization, spraying or screen-printing process, and the color layer includes at least one layer.

In the technical solution employed by embodiments of the present disclosure, in step a, the circuit board is a flexible circuit board.

In the technical solution employed by embodiments of the present disclosure, in step a, the surface hardening layer is a transparent hardened protection layer prepared by means of spraying using a transparent paint or ink.

In the technical solution employed by embodiments of the present disclosure, a substrate of the cover is glass, sapphire, zirconia ceramic or an organic thin film.

In the technical solution employed by embodiments of the present disclosure, the adhesive member is an epoxy, silica gel, or acrylic system adhesive or adhesive thin film.

In the technical solution employed by embodiments of the present disclosure, the adhesive member has a thickness of between 1 and 20 microns.

Embodiments of the present disclosure provide still another technical solution: a mobile terminal, including the above described fingerprint identification apparatus.

As compared with the prior art, the embodiments of the present disclosure achieve the following beneficial effects:

In the fingerprint identification apparatus and the method for manufacturing a fingerprint identification apparatus according to the above embodiments of the present disclosure, a texture layer is coated over on the fingerprint sensor or under the cover, and an appearance effect layer is formed by the texture layer and the color layer, such that an appearance effect of the fingerprint identification apparatus is comprehensively reflected. In this way, the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated. Further, the apparatus and method according to the present disclosure are applicable to a cover fingerprint identification solution and a coating fingerprint identification solution.

DETAILED DESCRIPTION

In order to facilitate understanding of the present disclosure, the present disclosure will be described more comprehensively with reference to relevant drawings. The accompanying drawings show preferred embodiments of the present disclosure. However, the present disclosure may be implemented in a plurality of forms or ways, and is not limited to the embodiments described herein. On the contrary, these embodiments are provided to make the understanding of the disclosed contents of the present disclosure more thorough and comprehensive.

Unless otherwise defined, all the technical and scientific terms used in this specification are the same as those usually understood by persons skilled in the art of the present disclosure. The terms in the specification of the present disclosure are only used to describe the specific embodiments, but not to limit the present disclosure.

Figure 1:
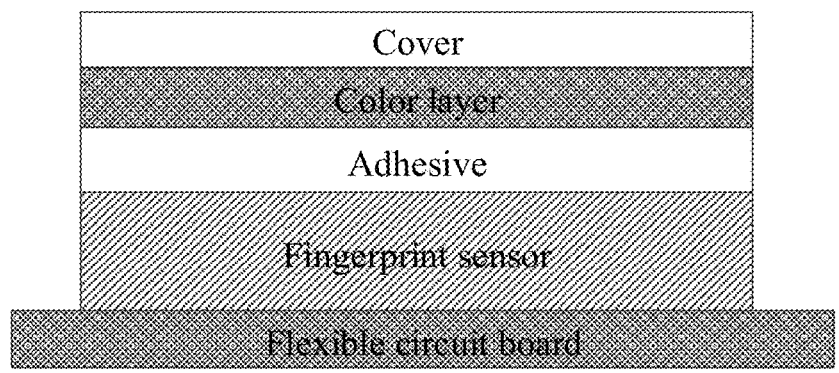
FIG. 1 is a stacking diagram of a fingerprint identification module in the conventional cover solution.
Figure 2:
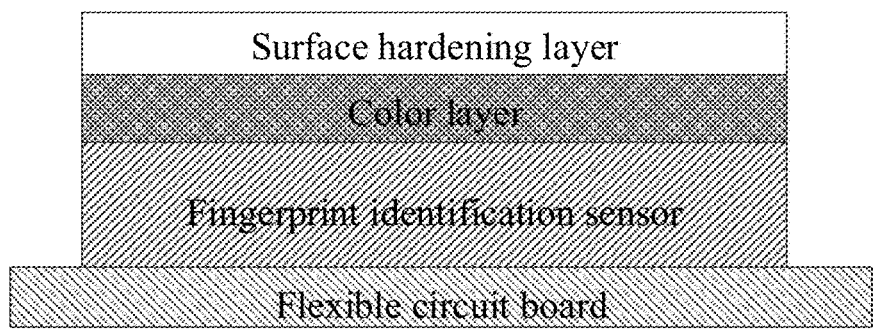
FIG. 2 is a stacking diagram of a fingerprint identification module in the conventional cover solution.

At present, an appearance preparation process of the fingerprint identification module mainly includes: attaching a cover having an appearance effect on the surface of the fingerprint sensor (cover solution), and directly coating an appearance effect layer on the surface of the fingerprint sensor (coating solution). Specifically as illustrated in FIG. 1 and FIG. 2, FIG. 1 is a stacking diagram of a fingerprint identification module in the conventional cover solution, and FIG. 2 is a stacking diagram of a fingerprint identification module in the conventional coating solution. These two preparation processes both employ the spraying or screen-printing technique, and the appearance effect is comprehensively reflected by using a color layer and a surface hardening layer/a cover. Therefore, the appearance effect lacks diversity, and the appearance effects of CD pattern, drawing wire and the like texture patterns may not be achieved.

Figure 3:
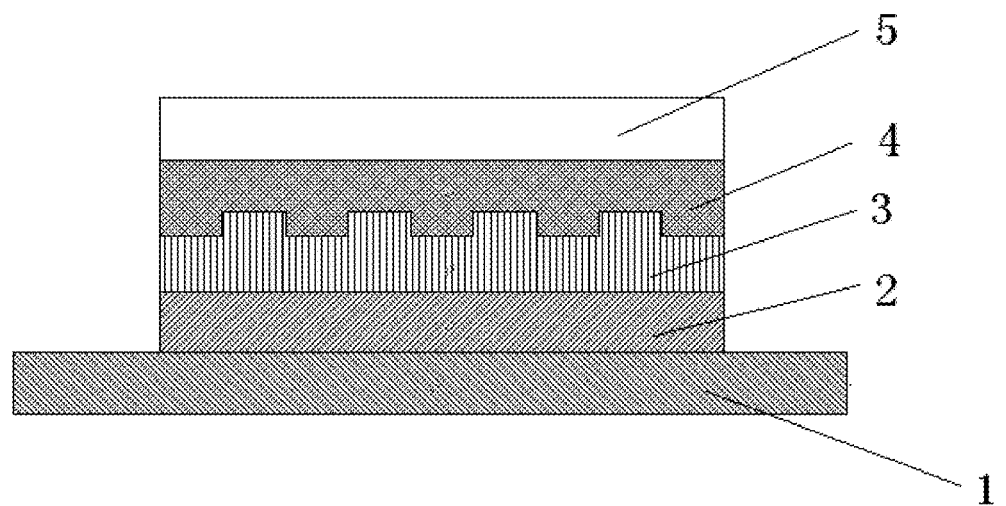
FIG. 3 is a schematic structural diagram of a fingerprint identification apparatus according to a first embodiment of the present disclosure.

FIG. 3 is a schematic structural diagram of a fingerprint identification apparatus according to a first embodiment of the present application. The fingerprint identification apparatus according to the first embodiment of the present disclosure includes: a circuit board 1, a fingerprint sensor 2, a texture layer 3, a color layer 4, and a surface hardening layer 5. The fingerprint sensor 2 is arranged on the circuit board 1, and is electrically connected to the circuit board 1. The texture layer 3 is arranged on an upper surface of the fingerprint sensor 2. The color layer 4 is arranged on a lower surface of the texture layer 3. The surface hardening layer 5 is coated over the color layer 4.

In the first embodiment of the present disclosure, the circuit board 1 is a flexible circuit board.

In the first embodiment of the present disclosure, the texture layer 3 is a transparent coating layer with ridges and valleys, and a texture pattern thereof is prepared by using the press-printing technique. The texture layer 3 is specifically prepared by: preparing a texture abrasive tool for making a texture pattern, coating a layer of a transparent colloid on the fingerprint sensor 2, and pressing the prepared texture abrasive tool onto the transparent colloid, such that a texture layer with valleys and ridges is formed on an upper surface of the fingerprint sensor 2. The transparent colloid includes an ultraviolet curable adhesive or a thermally curable adhesive.

In the first embodiment of the present disclosure, the color layer 4 may be prepared by means of screen-printing or spraying, and the color effect of the color layer 4 may be achieved by means of a non-conductive vacuum metallization (NCVM), spraying or screen-printing process, such that a color effect with metallic luster is achieved. The color layer 4 includes at least one layer.

After the texture layer 3 and the color layer 4 are prepared, an appearance effect layer is formed by the texture layer 3 and the color layer 4, and the appearance effect layer comprehensively reflects an appearance effect of the fingerprint identification effect, such that the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated.

In the first embodiment of the present disclosure, the appearance effect layer formed by the texture layer 3 and the color layer 4 has a thickness of between 1 and 20 microns, which does not affect the penetration of the fingerprint sensor 2.

In the first embodiment of the present disclosure, the surface hardening layer 5 is a transparent hardened protection layer prepared by means of spraying using a transparent paint or ink.

Figure 4:
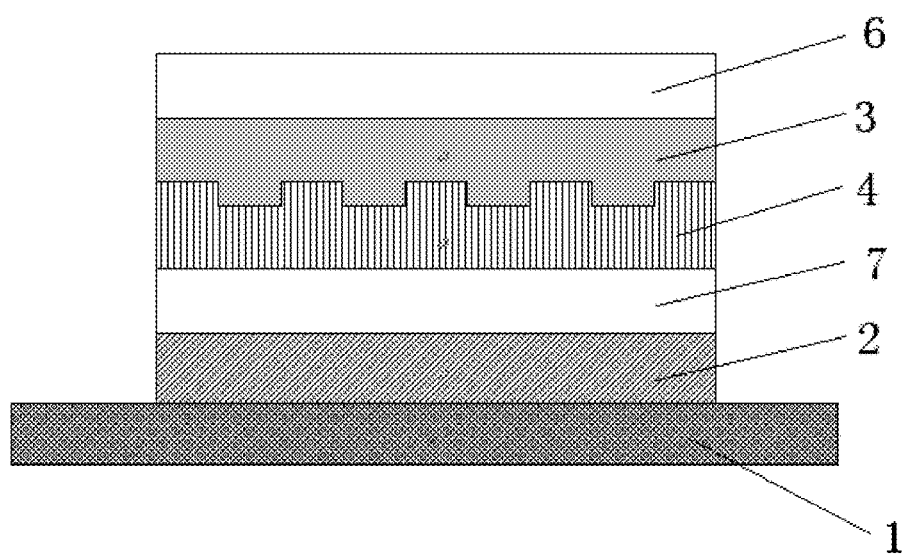
FIG. 4 is a schematic structural diagram of a fingerprint identification apparatus according to a second embodiment of the present disclosure.

FIG. 4 is a schematic structural diagram of a fingerprint identification apparatus according to a second embodiment of the present application. The fingerprint identification apparatus according to the second embodiment of the present disclosure includes: a circuit board 1, a fingerprint sensor 2, a texture layer 3, a color layer 4, a cover 6, and an adhesive member 7. The fingerprint sensor 2 is arranged on the circuit board 1, and is electrically connected to the circuit board 1. The texture layer 3 and the color layer 4 are sequentially arranged under the cover 6. A face of the cover 6 provided with the texture layer 3 and the color layer 4 is adhered to an upper part of the fingerprint sensor 2 via the adhesive member 7.

In the second embodiment of the present disclosure, the texture layer 3 is a transparent coating layer with ridges and valleys, and a texture pattern thereof is prepared by using the press-printing technique. The texture layer 3 is specifically prepared by: preparing a texture abrasive tool for making a texture pattern, coating a layer of a transparent colloid on a lower surface of the cover 6, and pressing the prepared texture abrasive tool onto the transparent colloid, such that a texture layer with valleys and ridges is formed on the lower surface of the cover 6. The transparent colloid includes an ultraviolet curable adhesive or a thermally curable adhesive.

After the texture layer 3 is prepared, a color layer may be prepared under the texture layer 3 by means of screen-printing or spraying. In the second embodiment of the present disclosure, a color effect of the color layer 4 may be achieved by means of a non-conductive vacuum metallization (NCVM), spraying or screen-printing process, such that a color effect with metallic luster is achieved. The color layer 4 includes at least one layer.

After the texture layer 3 and the color layer 4 are prepared, a face of the cover 6 provided with the texture layer 3 and the color layer 4 is adhered to an upper part of the fingerprint sensor 2 via the adhesive member 7, such that manufacturing of the fingerprint identification apparatus is complete. An appearance effect layer is formed by the texture layer 3 and the color layer 4 on the lower surface of the cover, and the appearance effect layer comprehensively reflects an appearance effect of the fingerprint identification effect, such that the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated.

In the second embodiment of the present disclosure, the appearance effect layer formed by the texture layer 3 and the color layer 4 has a thickness of several microns to several tens of microns, which does not affect the penetration of the fingerprint sensor 2.

In the second embodiment of the present disclosure, a substrate of the cover 6 is glass, sapphire, zirconia ceramic or an organic thin film, and the cover 5 includes at least one layer.

In the second embodiment of the present disclosure, the adhesive member 7 is an epoxy, silica gel, or acrylic system adhesive or adhesive thin film, and the adhesive member 7 has a thickness of between 1 and 20 microns.

Figure 5:
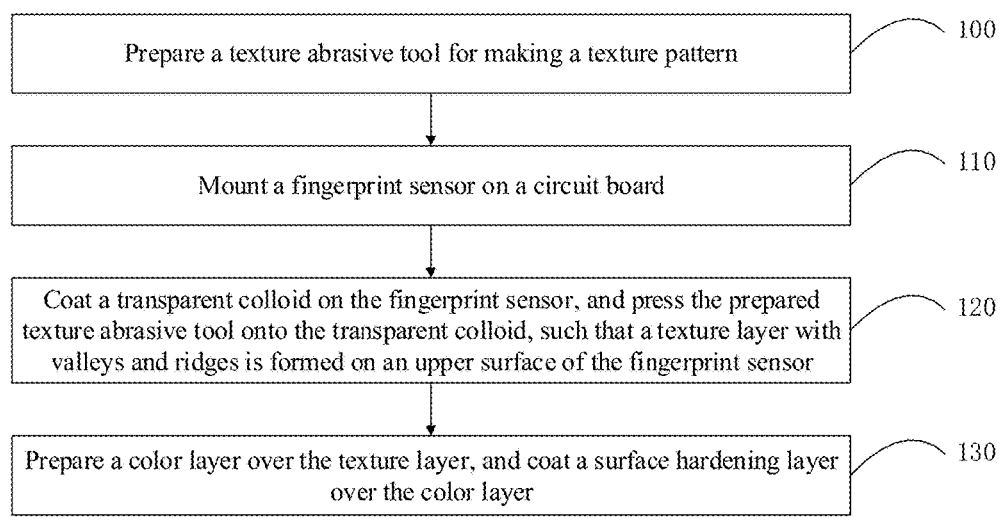
FIG. 5 is a schematic flowchart of a method for manufacturing a fingerprint identification apparatus according to a first embodiment of the present application.

FIG. 5 is a schematic flowchart of a method for manufacturing a fingerprint identification apparatus according to a first embodiment of the present application. The method for manufacturing a fingerprint identification apparatus according to the first embodiment of the present disclosure includes the following steps:

step 100: preparing a texture abrasive tool for making a texture pattern;

step 110: mounting a fingerprint sensor on a circuit board;

in step 110, the circuit board is a flexible circuit board;

step 120: coating a transparent colloid on the fingerprint sensor, and pressing the prepared texture abrasive tool onto the transparent colloid, such that a texture layer with valleys and ridges is formed on an upper surface of the fingerprint sensor;

in step 120, the transparent colloid includes an ultraviolet curable adhesive or a thermally curable adhesive; and step 130: preparing a color layer over the texture layer, and coating a surface hardening layer over the color layer.

In step 130, the color layer may be prepared by means of screen-printing or spraying, and the color effect of the color layer may be achieved by means of a non-conductive vacuum metallization (NCVM), spraying or screen-printing process, such that a color effect with metallic luster is achieved. The color layer includes at least one layer. The surface hardening layer is a transparent hardened protection layer prepared by means of spraying using a transparent paint or ink.

After the texture layer and the color layer are prepared, an appearance effect layer is formed by the texture layer and the color layer, and the appearance effect layer comprehensively reflects an appearance effect of the fingerprint identification effect, such that the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated.

In the embodiment of the present disclosure, the appearance effect layer formed by the texture layer and the color layer has a thickness of between several microns and several tens of microns, which does not affect the penetration of the fingerprint sensor.

Figure 6:
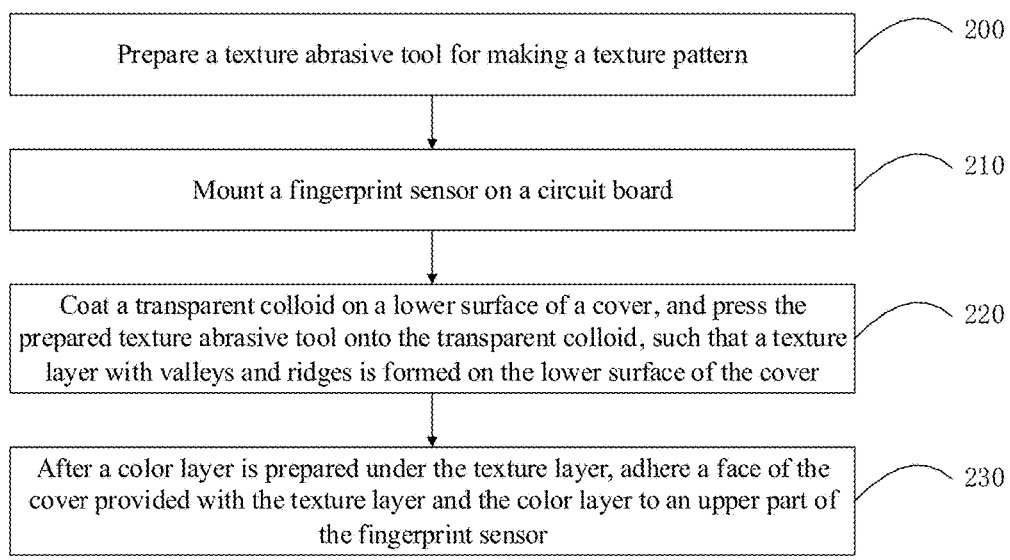
FIG. 6 is a schematic flowchart of a method for manufacturing a fingerprint identification apparatus according to a second embodiment of the present application.

FIG. 6 is a schematic flowchart of a method for manufacturing a fingerprint identification apparatus according to a second embodiment of the present application. The method for manufacturing a fingerprint identification apparatus according to the second embodiment of the present disclosure includes the following steps:

step 200: preparing a texture abrasive tool for making a texture pattern;

step 210: mounting a fingerprint sensor on a circuit board; in step 210, the circuit board is a flexible circuit board;

step 220: coating a transparent colloid on a lower surface of a cover, and pressing the prepared texture abrasive tool onto the transparent colloid, such that a texture layer with valleys and ridges is formed on the lower surface of the cover;

in step 220, the transparent colloid includes an ultraviolet curable adhesive or a thermally curable adhesive; and step 230: after a color layer is prepared under the texture layer, adhering a face of the cover provided with the texture layer and the color layer to an upper part of the fingerprint sensor.

In step 230, the color layer may be prepared by means of screen-printing or spraying, and the color effect of the color layer may be achieved by means of a non-conductive vacuum metallization (NCVM), spraying or screen-printing process, such that a color effect with metallic luster is achieved. The color layer includes at least one layer. A substrate of the cover is glass, sapphire, zirconia ceramic or an organic thin film. The adhesive member has a thickness of between 1 and 20 microns.

After the texture layer and the color layer are prepared, an appearance effect layer is formed by the texture layer and the color layer, and the appearance effect layer comprehensively reflects an appearance effect of the fingerprint identification effect, such that the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated.

In the embodiment of the present disclosure, the appearance effect layer formed by the texture layer and the color layer has a thickness of between several microns and several tens of microns, which does not affect the penetration of the fingerprint sensor.

It should be noted that the fingerprint identification apparatus and the method for manufacturing a fingerprint identification apparatus according to the above embodiments of the present disclosure may be applied to mobile phones, tablet computers, laptop computers, media players and the like mobile terminals having the fingerprint identification function.

In the fingerprint identification apparatus and the method for manufacturing a fingerprint identification apparatus according to the above embodiments of the present disclosure, a texture layer is coated over on the fingerprint sensor or under the cover, and an appearance effect layer is formed by the texture layer and the color layer, such that an appearance effect of the fingerprint identification apparatus is comprehensively reflected. In this way, the problems that the conventional appearance preparation process of the fingerprint identification module is limited and the prepared appearance effect lacks diversity are solved, and the requirements on diversity of the appearance effect imposed by the fingerprint identification apparatus and such mobile terminals as mobile phones employing the fingerprint identification apparatus are accommodated. Further, the apparatus and method according to the present disclosure are applicable to a cover fingerprint identification solution and a coating fingerprint identification solution.

Detailed above are exemplary implementation manners of the present disclosure, but the implementation manners of the present disclosure are not limited by the above embodiments. Any change, modification, replacement, combination, and simplification made within the spirit and principle of present disclosure should be equivalent displacement manners, and shall fall within the protection scope of the present disclosure.

What is claimed is:

1. A fingerprint identification apparatus, comprising: a circuit board, a fingerprint sensor, an appearance effect layer, a covering layer and an adhesive member; wherein the fingerprint sensor is arranged on the circuit board;
    wherein the appearance effect layer comprises a texture layer and a color layer, and the texture layer and the color layer are sequentially arranged under the covering layer;
    wherein a face of the covering layer provided with the texture layer and the color layer is adhered to an upper part of the fingerprint sensor via the adhesive member;
    wherein the covering layer is a surface hardening layer, and the surface hardening layer is a transparent hardened protection layer prepared by means of spraying using a transparent paint or ink.

2. The fingerprint identification apparatus according to claim 1, wherein the appearance effect layer has a thickness of several microns to several tens of microns.

3. The fingerprint identification apparatus according to claim 1, wherein the texture layer is a transparent colloid, the transparent colloid comprising an ultraviolet curable adhesive or a thermally curable adhesive.

4. The fingerprint identification apparatus according to claim 1, wherein the color layer comprises a plurality of layers.

5. The fingerprint identification apparatus according to claim 1, wherein the adhesive member is an epoxy, silica gel, or acrylic system adhesive or adhesive thin film.

6. The fingerprint identification apparatus according to claim 1, wherein the adhesive member has a thickness of between 1 and 20 microns.

7. A method for manufacturing a fingerprint identification apparatus, comprising:
    step a: mounting a fingerprint sensor on a circuit board; and
    step b: coating a transparent colloid on a lower surface of a covering layer, and pressing a prepared texture abrasive tool onto the transparent colloid, such that a texture layer with valleys and ridges is formed on the lower surface of the covering layer; and after a color layer is prepared under the texture layer, adhering a face of the covering layer provided with the texture layer and the color layer to an upper part of the fingerprint sensor via an adhesive member;

wherein, the covering layer is a surface hardening layer, the surface hardening layer is a transparent hardened protection layer prepared by means of spraying using a transparent paint or ink.

8. The method for manufacturing a fingerprint identification apparatus according to claim 7, wherein in step b, the color layer is prepared by means of a non-conductive vacuum metallization, spraying or screen-printing process, and the color layer comprises at least one layer.

9. A mobile terminal, comprising a fingerprint identification apparatus as defined in claim 1.

\* \* \* \* \*